(12) United States Patent
Vinson et al.

(10) Patent No.: US 9,923,562 B1
(45) Date of Patent: Mar. 20, 2018

(54) DATA STORAGE DEVICE STATE DETECTION ON POWER LOSS

(71) Applicant: Western Digital Technologies, Inc., Irvine, CA (US)

(72) Inventors: Wayne H. Vinson, Longmont, CO (US); Travis D. Fox, Edmond, OK (US)

(73) Assignee: Western Digital Technologies, Inc., San Jose, CA (US)

( * ) Notice: Subject to any disclaimer, the term of this patent is extended or adjusted under 35 U.S.C. 154(b) by 96 days.

(21) Appl. No.: 15/184,936

(22) Filed: Jun. 16, 2016

(51) Int. Cl.
*H03K 21/40* (2006.01)
*G06F 3/06* (2006.01)

(52) U.S. Cl.
CPC .......... *H03K 21/403* (2013.01); *G06F 3/064* (2013.01); *G06F 3/0619* (2013.01); *G06F 3/0634* (2013.01); *G06F 3/0679* (2013.01)

(58) Field of Classification Search
CPC ...... G06F 3/064; G06F 3/0679; G06F 3/0619; G06F 3/0634; H03L 21/403
See application file for complete search history.

(56) References Cited

U.S. PATENT DOCUMENTS

| | | | |
|---|---|---|---|
| 5,448,719 A | 9/1995 | Schultz et al. | |
| 7,800,856 B1 | 9/2010 | Bennett et al. | |
| 8,166,247 B2 | 4/2012 | Schwarz et al. | |
| 8,543,766 B2 | 9/2013 | Grayson et al. | |
| 9,122,615 B1 | 9/2015 | Jenkins et al. | |
| 2010/0169557 A1 | 7/2010 | Morris | |
| 2013/0346683 A1 | 12/2013 | Walker | |
| 2015/0006815 A1 | 1/2015 | Madhusudana et al. | |
| 2016/0139808 A1* | 5/2016 | Stevens, Jr. | G06F 3/062 711/163 |

OTHER PUBLICATIONS

Pending U.S. Appl. No. 14/870,571, filed Sep. 30, 2015, entitled "Data Storage Device and Method for Using Secondary Non-Volatile Memory for Temporary Metadata Storage".
Pending U.S. Appl. No. 14/639,555, filed Mar. 5, 2015, entitled "Power Safe Write Buffer for Data Storage Device".

* cited by examiner

*Primary Examiner* — Gary W. Cygiel
(74) *Attorney, Agent, or Firm* — Barry IP Law (57) ABSTRACT

Upon a first transition from a first state to a second state, a first bit in a memory unit comprising a plurality of bits is programmed. Upon a first transition from the second state to the first state, a second bit in the memory unit is programmed, the second bit being before the first bit in the sequence of the plurality of bits. Upon a second transition from the first state to the second state, a third bit in the memory unit is programmed, the third bit being subsequent to the first bit by at least two bits in the sequence of the plurality of bits. Upon a second transition from the second state to the first state, a fourth bit in the memory unit is programmed, the fourth bit being before the third bit in the sequence of the plurality of bits.

22 Claims, 4 Drawing Sheets

FIG. 1

| | |
|---:|:---|
| Initial State | 1111111111111111111111111111111...1 |
| First Transition to First State | 1011111111111111111111111111111...1 |
| First Transition From First State to Second State | 0011111111111111111111111111111...1 |
| Second Transition To First State | 0010111111111111111111111111111...1 |
| Second Transition From First State To Second State | 0000111111111111111111111111111...1 |

DATA STORAGE DEVICE STATE DETECTION ON POWER LOSS

BACKGROUND

Data Storage Devices (DSDs) are often used to record data onto or to reproduce data from a storage media. In addition to Non-Volatile Memory (NVM) that retains data across power cycles, DSDs may also include volatile memory that does not retain data across power cycles. Under normal operating conditions, the DSD can migrate data from volatile memory to NVM that may be needed after powering off. However, in some cases, power may be unexpectedly lost or there may not be enough time to migrate data from the volatile memory. In such cases, the DSD may encounter errors when powering up after the power loss since the data stored in the volatile memory is no longer accessible.

BRIEF DESCRIPTION OF THE DRAWINGS

The features and advantages of the embodiments of the present disclosure will become more apparent from the detailed description set forth below when taken in conjunction with the drawings. The drawings and the associated descriptions are provided to illustrate embodiments of the disclosure and not to limit the scope of what is claimed.

DETAILED DESCRIPTION

In the following detailed description, numerous specific details are set forth to provide a full understanding of the present disclosure. It will be apparent, however, to one of ordinary skill in the art that the various embodiments disclosed may be practiced without some of these specific details. In other instances, well-known structures and techniques have not been shown in detail to avoid unnecessarily obscuring the various embodiments.

System Overview

Figure 1:
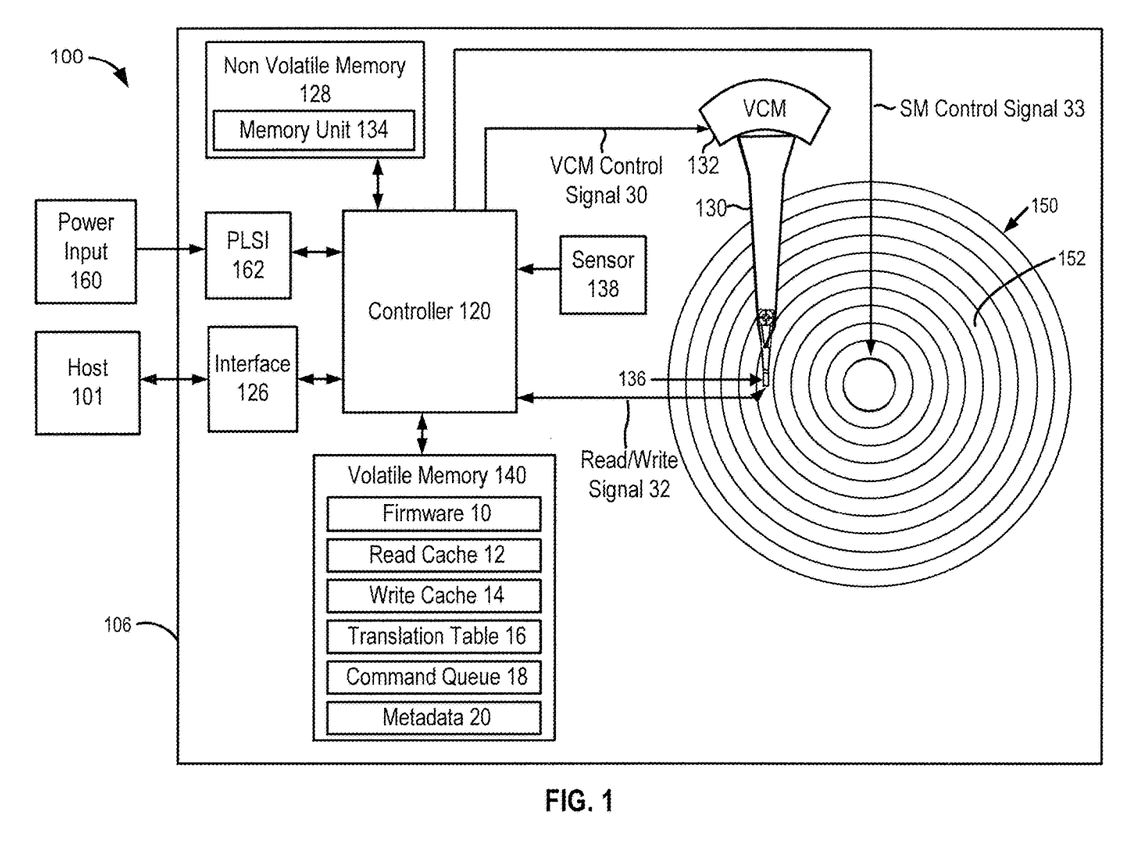
FIG. 1 is a block diagram depicting a Data Storage Device (DSD) according to an embodiment.

FIG. 1 shows system 100 according to an embodiment which includes host 101 and Data Storage Device (DSD) 106. System 100 can be, for example, a computer system (e.g., server, desktop, mobile/laptop, tablet, smartphone, etc.) or other electronic device such as a Digital Video Recorder (DVR). In this regard, system 100 may be a stand-alone system or part of a network, such as a local or wide area network, or the Internet.

As shown in the example embodiment of FIG. 1, DSD 106 includes Non-Volatile Memory (NVM) in the form of rotating magnetic disk 150 and Non-Volatile Solid-State Memory (NVSM) 128. In this regard, DSD 106 can be considered a Solid-State Hybrid Drive (SSHD) since it includes both solid-state and disk media. In other embodiments, one of NVSM 128 or disk 150 may be omitted. In yet other embodiments, each of disk 150 or NVSM 128 can be replaced by multiple Hard Disk Drives (HDDs) or multiple Solid-State Drives (SSDs), respectively, so that DSD 106 includes pools of HDDs and/or SSDs.

DSD 106 includes controller 120 which includes circuitry such as one or more processors for executing instructions and can include a microcontroller, a Digital Signal Processor (DSP), an Application-Specific Integrated Circuit (ASIC), a Field Programmable Gate Array (FPGA), hard-wired logic, analog circuitry and/or a combination thereof. In one implementation, controller 120 can include a System On a Chip (SoC).

Interface 126 is configured to interface DSD 106 with host 101 and may interface according to a standard such as, for example, Serial Advanced Technology Attachment (SATA), PCI express (PCIe), Small Computer System Interface (SCSI), or Serial Attached SCSI (SAS). As will be appreciated by those of ordinary skill in the art, interface 126 can be included as part of controller 120.

Host 101 communicates with DSD 106 via interface 126 to retrieve data from and store data in DSD 106. As used herein, a host can refer to a device that is capable of issuing commands to a DSD to store data or retrieve data. In this regard, host 101 may include another storage device such as a smart DSD that is capable of executing applications and communicating with other DSDs.

The components of FIG. 1 may or may not be physically co-located. In this regard, host 101 and DSD 106 may be connected using a bus, a local area network, a wide area network, or the Internet. Those of ordinary skill in the art will also appreciate that other embodiments can include more or less than those elements shown in FIG. 1 and that the disclosed processes can be implemented in other environments. For example, other embodiments can include a different number of hosts or DSDs.

In FIG. 1, disk 150 is rotated by a spindle motor (not shown) and head 136 is positioned to read and write data on the surface of disk 150. In more detail, head 136 is connected to the distal end of actuator 130 which is rotated by Voice Coil Motor (VCM) 132 to position head 136 over disk 150 to read or write data in tracks (not shown). A servo system (not shown) of controller 120 controls the rotation of disk 150 with SM control signal 33 and controls the position of head 136 using VCM control signal 30.

As will be appreciated by those of ordinary skill in the art, disk 150 may form part of a disk pack including multiple disks that are radially aligned with disk 150. In such implementations, head 136 may form part of a Head Stack Assembly (HSA) including heads arranged to read data from and write data to a corresponding disk surface in the disk pack. As shown in FIG. 1, disk 150 includes tracks 152 for storing data.

DSD 106 may also include NVSM 128 for storing data in blocks or sectors of NVSM 128. Memory unit 134 is a unit of erasure that can represent the smallest amount of memory that can be erased in one erase operation. In an example where NVSM 128 is flash solid-state memory, memory unit 134 can be a single block. As discussed below, memory unit 134 may store data indicating a status or state of DSD 106.

While the description herein refers to solid-state memory generally, it is understood that solid-state memory may comprise one or more of various types of memory devices such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistive RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete NVM (non-volatile memory) chips, or any combination thereof.

As shown in FIG. 1, DSD 106 includes volatile memory 140, which can include, for example, a Dynamic Random Access Memory (DRAM). In some embodiments, volatile memory 140 can be a volatile memory used by DSD 106 to temporarily store data. In other embodiments, volatile memory 140 can be an NVM that can be quickly accessed. Data stored in volatile memory 140 can include data read from NVM such as disk 150, data to be stored in NVM, instructions loaded from firmware 10 for execution by controller 120, and/or data used in executing firmware 10.

In the example of FIG. 1, volatile memory 140 stores firmware 10, read cache 12, write cache 14, translation table 16, command queue 18, and metadata 20. Firmware 10 includes computer-executable instructions that can be executed by controller 120 to control operation of DSD 106. In some implementations, firmware may be stored in NVSM 128 or on disk 150, and firmware 10 in volatile memory 140 may represent a portion of the full firmware that is being referenced by controller 120.

Read cache 12 can include data that has been read from NVM such as data read from disk 150 or NVSM 128. The read data may include data read in preforming a host read command from host 101 requesting data from DSD 106. In such an example, the read data may be stored in read cache 12 before being sent to host 101 via interface 126.

Write cache 14 can include write data to be written in NVM such as disk 150 or NVSM 128. The write data may include data received from host 101 via interface 126 as part of a host write command to store the write data in DSD 106.

Translation table 16 maps logical addresses (e.g., Logical Block Addresses (LBAs)) to physical addresses in one or more NVM such as disk 150 or NVSM 128. As data is written or erased, the mapping in translation table 16 is updated. In some implementations, translation table 16 can be used to periodically update a translation table stored in NVM. Translation table 16 in volatile memory 140 may also represent a portion of a full translation table that is being referenced by controller 120. In this regard, translation table 16 may be a limited resource in that only a certain amount of space in volatile memory 140 may be allocated for storing translation table 16.

In some implementations, a status or modification state of translation table 16 can be tracked in memory unit 134 of NVSM 128. This can allow for later determining what the state of translation table 16 was when power was lost at volatile memory 140. One such state can include whether there had been changes to translation table 16 since it had been last copied to NVM. Another state could include whether portions of translation table 16 were in the process of being copied to NVM. This can, for example, help in troubleshooting an error or recovering after an unexpected power loss.

In an example where data from translation table 16 is in the process of being written to disk 150, an unexpected power loss can cause an incomplete write of data in a sector on disk 150 (i.e., a write splice). Data in the sector is then typically not readable after the incomplete write and the data is usually lost after the unexpected power loss. Reading memory unit 134 during startup may then provide an indication that translation table 16 was not written to NVM or that translation table 16 was in the process of being copied to disk 150 when power was lost.

Command queue 18 keeps track of pending commands for performance on disk 150. For example, command queue 18 can include write commands and read commands that have been received from host 101 but have not yet been performed on disk 150. A command for writing the valid data from write cache 14 to its new location on disk 150 can be included in command queue 18. As with translation table 16, memory unit 134 can be used to track a status of the command queue 18, such as whether there are pending commands in command queue 18.

Metadata 20 can include information such as where a particular piece of data is on NVM of DSD 106, the last time the data was written, or user ownership information of the data. In some implementations, metadata 20 may be a limited resource in that only a certain amount of space in volatile memory 140 may be allocated for storing metadata 20. In other implementations, metadata may be stored in NVSM 128 or on disk 150, and metadata 20 in volatile memory 140 may represent a portion of a metadata that is being referenced by controller 120.

In some implementations, a status or modification state of metadata 20 can be tracked in memory unit 134 of NVSM 128. As discussed below, this can allow for later determining what the state of metadata 20 was when power was lost at volatile memory 140. This can, for example, help in troubleshooting or recovering after an unexpected power loss. In an example where metadata 20 is in the process of being written to disk 150, an unexpected power loss can cause an incomplete write of the metadata in a sector on disk 150 (i.e., a write splice). The sector is then typically not readable after the incomplete write and the metadata is usually lost after the unexpected power loss. Reading memory unit 134 during startup may then provide an indication that metadata 20 was not written to NVM or that metadata 20 was in the process of being written to disk 150 when power was lost.

As shown in FIG. 1, DSD 106 includes sensor 138 which may be any sensor configured to detect conditions of the DSD. For example, sensor 138 may be a vibration sensor configured to detect vibration levels of DSD 106 or portions of DSD 106. In other implementations, sensor 138 can include a temperature, air pressure, or humidity sensor to detect whether an environmental condition of DSD 106 is within a safe operating range. In some implementations, a status of the environmental condition can be tracked in memory unit 134 so that a previous state of the environmental condition can be determined later on. In one example, the previous state of the environmental condition can be used to troubleshoot an error or failure of DSD 106.

DSD 106 also includes Power Large Scale Integrated (PLSI) circuit 162 which receives power via a power input 160 for powering DSD 106. PLSI 162 may be configured to detect power levels from the power input 160. In some implementations, a status of a power level detected by PLSI 162 can be tracked in memory unit 134 so that a previous power state can be determined later on. In one example, the previous power state can be used to troubleshoot a power loss or other type of power failure of DSD 106, such as a brownout.

In operation, interface 126 receives host read and write commands from host 101 for reading data from and writing data to NVM of DSD 106. In response to a write command from host 101, controller 120 may buffer the data to be written for the write commands in write cache 14 of volatile memory 140, based on whether write caching is enabled or disabled.

When write caching is disabled, DSD 106 writes the data received from the host 101 to NVM and then communicates an indication to the host 101 via controller 120 that the received data was written. When data is written to NVM of DSD 106, metadata 20 may also be updated.

When write caching is enabled, DSD 106 receives data from the host 101, stores the data in write cache 14 of volatile memory 140, and communicates an indication to the host 101 via controller 120 that the received data was written before writing the data to NVM of DSD 106. This can allow DSD 106 to defer writing data in NVM to improve the performance of DSD 106 or to improve an overall performance of system 100. In one example, enabling write caching can allow host 101 to issue new commands that would otherwise need to wait until data from a previous write command is stored in NVM. In another write caching example, multiple write commands may be received and the corresponding data written to NVM of DSD 106 in an efficient manner, using, for example, rotational position optimization. When rotational position optimization is implemented, data entries may be written to disk 150 in an order that is different from the order in which they were received from host 101 to reduce the distance travelled by head 136.

In a situation where power is lost and write caching is enabled, data that was stored in write cache 14 of volatile memory 140 may be lost, resulting in errors after powering up, such as a corrupted file system. As described below, in such situations, it may be useful to record whether data was located in write cache 14 when power was lost. In some implementations, memory unit 134 of NVSM 128 can be used to track a status of whether write cache 14 includes data waiting to be written in NVM. After powering up, the state of write cache 14 (e.g., empty or not empty) can be determined. In one example, knowing whether there was data in write cache 14 when power was lost to volatile memory 140 can help troubleshoot an error after powering up from an unexpected power loss.

For data to be written on disk 150, a read/write channel (not shown) of controller 120 may encode the buffered data into write signal 32 which is provided to head 136 for magnetically writing data on disk 150. A servo system of controller 120 can provide VCM control signal 30 to VCM 132 to position head 136 over a particular track for writing the data.

To read data from disk 150, the servo system positions head 136 over a particular track on disk 150. Controller 120 controls head 136 to magnetically read data stored in the track and to send the read data as read signal 32. A read/write channel of controller 120 can then decode and buffer the data into read cache 12 of volatile memory 140 for transmission to host 101 via interface 126.

For data to be stored in NVSM 128, controller 120 receives data from interface 126 and may buffer the data in volatile memory 140. In one implementation, the data is then encoded into charge values for charging cells (not shown) of NVSM 128 to store the data.

To access data stored in NVSM 128, controller 120 in one implementation reads current values for cells in NVSM 128 and decodes the current values into data that can be transferred to host 101 via interface 126.

Write Cache State Examples

In some situations, when DSD 106 is being set up for system 100, write commands of system files may be issued to DSD 106 with write caching enabled. In some such situations, power may be disconnected from DSD 106 before the system files in write cache 14 are written to NVM of DSD 106. In these situations, DSD 106 may appear to be defective, as it is corrupted upon startup of system 100. However, the cause of the error may be that power was interrupted to DSD 106 with data in write cache 14, resulting in corrupted data. If the state of the write cache 14 at the time of power loss may be tracked and stored, then upon a subsequent starting up of DSD 106, it may be determined by controller 120 whether a DSD 106 error is a result of data corruption due to loss of power in a state where write cache 14 contains data. As used herein, the presence of data in write cache 14 may be referred to as a "dirty write cache" and the absence of data in write cache 14 may be referred to as a "clean write cache."

In some implementations, PLSI 162 may be configured to anticipate a power loss situation. When PLSI 162 anticipates power loss, the DSD 106 may implement a power safe write buffer (PSWB) where all host data in the write cache 14 is saved to NVM on power loss. DSD 106 may generate the power to perform the PSWB using stored kinetic energy of the already spinning disk 150 or by using a stored power source. Upon a subsequent starting up of DSD 106, it may be determined whether write cache 14 contained data at the time of power loss based on a determination of whether the PSWB was implemented.

Alternatively, a 1-byte indicator may be programmed when PLSI 162 anticipates power loss, with the 1-byte indicator programmed based on whether the write cache 14 is a dirty write cache or a clean write cache. Power to perform the programming of the 1-byte indicator may be generated using stored kinetic energy of the already spinning disk 150 or by using a stored power source.

Figure 2:
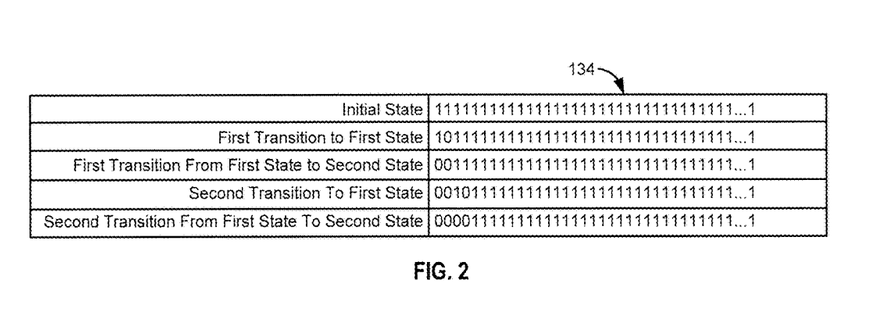
FIG. 2 depicts an example table of states and events and the associated data stored in the DSD according to an embodiment.

In another implementation, a memory unit associated with the state of write cache 14 may be updated as the state of write cache 14 changes, obviating power loss anticipation and power demands associated with performing operations after power loss occurs. FIG. 2 depicts an example memory unit 134 of NVSM 128 according to an embodiment. Memory unit 134 may comprise a sector or block of NVSM 128, which may be, for example, NOR or NAND flash memory.

Bits within the memory unit 134 may be programmed from an erased state to a non-erased state. For example, when NVSM 128 is a NOR flash memory, a clean, fully erased sector comprises bits of all 1's. Individual bits within the NOR flash memory may be programmed from 1 to 0, programming the bits from an erased state to a non-erased state. In order to program any bit from 0 to 1, the entire sector may be erased. Accordingly, the example memory unit 134 in FIG. 2 comprises bits of all 1's in the initial state. The initial state may be represented by a bit sequence matching the regular expression 0*1*. In alternative implementations, the initial state may include all 0's and the bits may be programmed from 0 to 1 to track the state of write cache 14.

Upon a first transition to a first state, a first bit is programmed from 0 to 1. In the example memory unit 134 shown in FIG. 2, the first bit is second from the left. The first state may be represented by a bit sequence matching the regular expression 0*101*.

Upon a first transition from the first state to a second state, a second bit, which is before the first bit, is programmed from 0 to 1. In the example memory unit 134 shown in FIG. 2, the second bit is first from the left. In alternative implementations, the order of the bits in considering which bit is before or after another bit may proceed from right to left, instead of from left to right as in the example of FIG. 2. The second state may be represented by a bit sequence matching the regular expression 0*1*, similar to the initial state. In some implementations, the initial state may be classified as being the second state.

Upon a second transition to the first state, a third bit, which is subsequent to the first bits by at least two bits, is programmed from 0 to 1. In the example memory unit 134 shown in FIG. 2, the third bit is fourth from the left. Accordingly, the bit sequence of memory unit 134 matches the regular expression 0*101*, and the first state is indicated.

Upon a second transition from the first state to the second state, a fourth bit is programmed from 0 to 1. In the example memory unit 134 shown in FIG. 2, the fourth bit is third from the left. Accordingly, the bit sequence of memory unit 134 matches the regular expression 0*1*, and the second state is indicated. The process of programming bits may be performed without any intervening erase operation on the memory unit 134. At this point, the process described with memory unit 134 shown in FIG. 2 may be repeated.

In various embodiments, when NVSM 128 is a NOR flash memory, the NVSM 128 may be capable of a finite number of program/erase cycles per sector. Accordingly, in order to maximize the useful life of the memory unit 134, it may be desirable to maximize a number of times a state is tracked between erasures of the memory unit 134. As NOR flash memory is bit programmable, the number of times a state may be tracked before an erase operation is performed may be maximized by the systems and methods described herein. For example, when memory unit 134 is a single 4 KB sector, using the systems and methods described herein, 16,384 first state/second state cycles may be recorded before the sector is exhausted and subsequently erased. Once the memory unit 134 is erased, the first state/second state cycle may be recorded 16,384 more times before another erasure.

Figure 3:
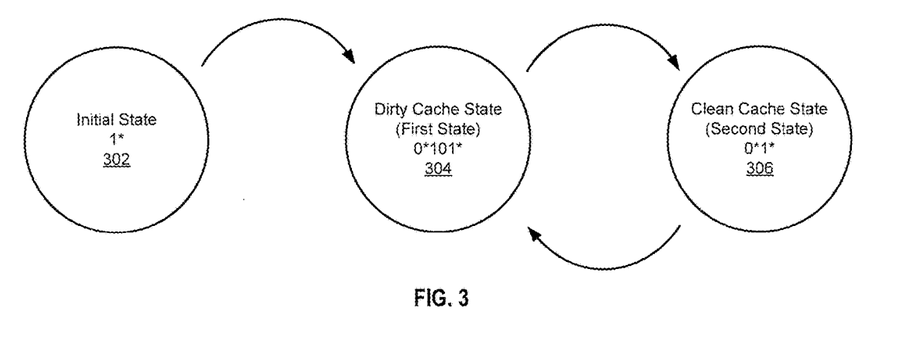
FIG. 3 illustrates an example of state diagram updating and tracking according to an embodiment.

FIG. 3 illustrates an example state diagram for updating and tracking write cache state. As described herein, write cache 14 of DSD 106 may be in an unwritten "clean" state or a written "dirty" state. When power to the DSD 106 is lost while the write cache 14 is in the dirty state, data in NVM of DSD 106 may be corrupted, as described herein.

In an initial state 302, the memory unit 134 may comprise bits of all 1's and the bit sequence may match the regular expression 0*1*, 1*, or 11*. When data is written to write cache 14 of DSD 106, bits within memory unit 134 may be programmed to reflect the write cache 14 having a dirty cache state 304. The dirty cache state 304 may be a first state and the bit sequence may match the regular expression 0*101*. When the cached data is written to NVM of DSD 106, write cache 14 is cleared and bits within memory unit 134 may be programmed to reflect the write cache 14 having a clean cache state 306. The clean cache state 306 may be a second state and the bit sequence may match the regular expression 0*1*.

When data is again written to write cache 14 of DSD 106, bits within memory unit 134 may again be programmed to reflect the write cache 14 having the dirty cache state 304. States may alternate between the dirty cache state (first state) 304 and the clean cache state (second state) 306 based on the writing and clearing of write cache 14. When all of the bits within memory unit 134 are set to 0's (the bit sequence thereby matching regular expression 0*), the memory unit 134 may be erased, causing the memory unit 134 to again be in initial state 302, comprising bits of all 1's.

In other embodiments, a different state may be tracked using memory unit 134. Examples of such states can include a modification state of translation table 16 (e.g., translation table 16 not updated in NVM), a state of command queue 18 (commands pending in command queue 18), a modification state of metadata 20 (e.g., metadata not updated in NVM), an environmental condition of DSD 106 (e.g., a vibration or temperature condition with respect to a threshold), a power state of DSD 106 (e.g., a power usage with respect to a threshold), or a storage state of volatile memory 140 (e.g., empty write cache 14).

While the example state diagram of FIG. 3 illustrates the initial state 302 as being a separate state, in various embodiments, the initial state may be the clean cache state (second state) 306.

State Tracking Examples

Figure 4:
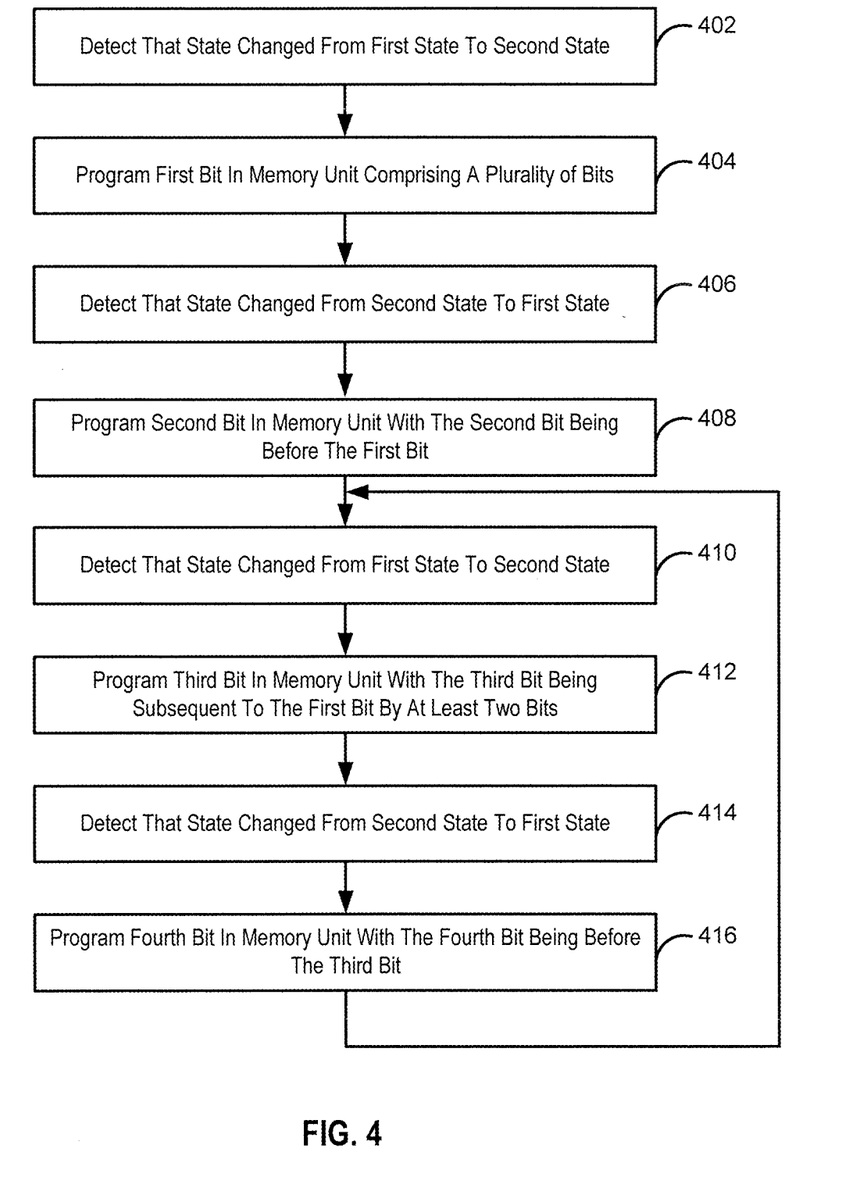
FIG. 4 is a flowchart for a state tracking process according to an embodiment.

FIG. 4 is a flowchart for tracking state according to an embodiment. The processes illustrated by FIGS. 4 and 5 may be used when tracking a status related to an operation of DSD 106. As noted above, the status may indicate a storage state of the DSD 106, such as the write cache 14 state. The status may indicate a power state, such as power detected by PLSI 162. The status may indicate a modification state of translation table 16 or metadata 20. The status may indicate an environmental condition of the DSD 106, such as vibration detected by sensor 138.

Figure 5:
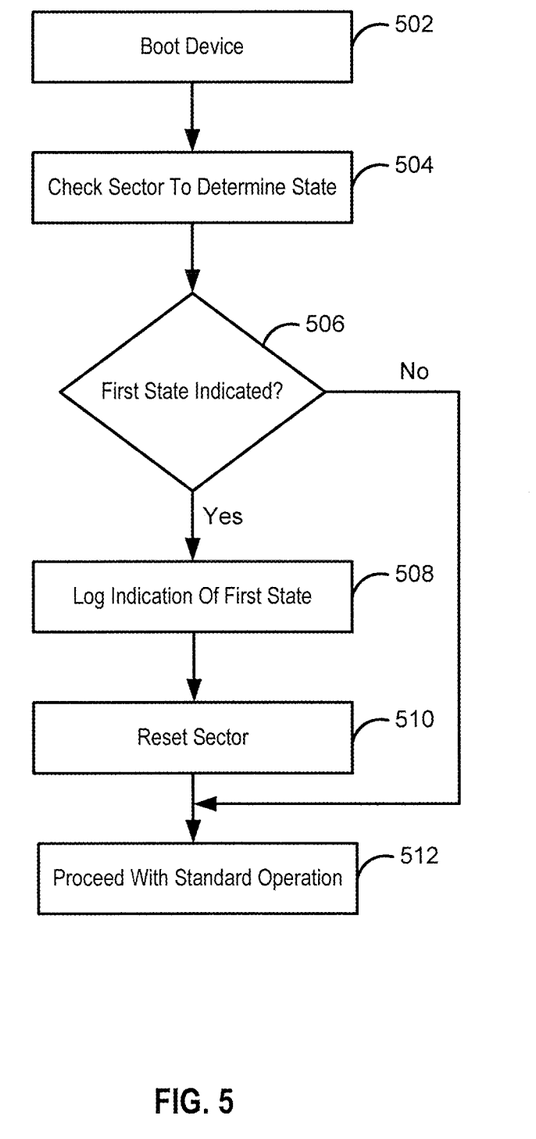
FIG. 5 is a flowchart for a state detection process according to an embodiment.

The processes illustrated by FIGS. 4 and 5 may be used in any situation where state tracking of any aspect of the DSD 106 at the time of power loss is desired or when the DSD 106 is occupied while performing an operation and state tracking of any aspect of the DSD 106 is desired.

In block 402, a state change from a first state to a second state is detected. In some implementations, the state change from the first state to the second state is detected by sensor 138. For example, sensor 138 may be a vibration sensor and the first state may be associated with a vibration measurement exceeding a first vibration threshold. In some implementations, the state change from the first state to the second state is detected by controller 120 evaluating the contents of volatile memory 140 or detecting a change in contents of volatile memory 140. For example, the first state may be associated with data being written to write cache 14. In another example, the first state may be associated with translation table 16 or metadata 20 being modified. In some implementations, the state change from the first state to the second state is detected by PLSI 162, and the first state may be associated with a power measurement below a first power threshold.

In block 404, a first bit in memory unit 134 comprising a plurality of bits, is programmed. The first bit may be programmed from an erased state to a non-erased state. When the memory unit 134 comprises 1's when the memory unit 134 is erased, the first bit is programmed from 1 to 0. The bit sequence of memory unit 134 may match the regular expression 0*1*.

In block 406, a state change from the second state to the first state is detected. The state change may be detected by sensor 138. For example, sensor 138 may be a vibration sensor and the second state may be associated with a vibration measurement below a second vibration threshold lower than the first vibration threshold. Alternatively, the second state may be associated with a vibration measurement below the first vibration threshold. In some implementations, the state change from the second state to the first state is detected by controller 120 evaluating the contents of volatile memory 140 or detecting a change in contents of volatile memory 140. For example the second state may be associated with data being cleared from write cache 14 or modification to translation table 16 or metadata 20 being completed. In some implementations, the state change from the second state to the first state is detected by PLSI 162, and the second state may be associated with a power measurement exceeding a second power threshold or the power measurement exceeding the first power threshold.

In block 408, a second bit in memory unit 134 is programmed. The second bit may be programmed from an erased state to a non-erased state. In some implementations, the second bit is before the first bit in the sequence of bits, and is programmed from 1 to 0. The bit sequence of memory unit 134 may match the regular expression 0*101*.

In block 410, a state change from the first state to the second state is detected, as described herein.

In block 412, a third bit in memory unit 134 is programmed. The third bit may be programmed from an erased state to a non-erased state. In some implementations, the third bit is subsequent to the first bit by at least two bits in the sequence of bits, and is programmed from 1 to 0. The bit sequence of memory unit 134 may match the regular expression 0*1*.

In block 414, a state change from the second state to the first state is detected, as described herein.

In block 416, a fourth bit in memory unit 134 is programmed. The fourth bit may be programmed from an erased state to a non-erased state. In some implementations, the fourth bit is before the third bit the sequence of bits, and is programmed from 1 to 0. The bit sequence of memory unit 134 may match the regular expression 0*101*.

Blocks 404, 408, 412, and 416 may be performed without any intervening erase operations. The process returns to block 410, and may repeat until all bits of memory unit 134 are programmed from 1 to 0.

FIG. 5 is a flowchart for using the tracked state according to an embodiment. In block 502, DSD 106 is booted. In some implementations, DSD 106 may be booted using boot data stored in NVM of DSD 106.

In block 504, a sector or block of NVSM 128 is checked to determine state. In some implementations, the sector or block of NVSM 128 is memory unit 134. State may be expressed using a series of 1's and 0's, as described herein.

In block 506, the controller 120 determines whether a first state is indicated. In some implementations, the first state is indicated when the bits of memory unit 134 match a particular regular expression. The regular expression associated with the first state may be 0*101*.

In block 508, when the first state is indicated, an indication of the first state is logged. In some implementations, the log is stored in disk 150 and the indication of the first state may be logged by controller 120. The log may include multiple entries, each associated with an instance of the first state being detected upon booting of the DSD 106. For example, the log may include 20 entries, each with a date and time of when the sector indicated upon booting of the DSD 106, that the write cache 14 was a dirty write cache when power was lost. Other information may be stored in the log and associated with an entry of when the first state is detected upon booting the DSD 106.

In block 510, the sector of NVSM 128 (e.g., memory unit 134) is reset. The sector of NVSM 128 may be reset by erasing the sector. When the NVSM 128 is NOR flash memory, erasing the sector can result in the bits of the sector being programmed to all 1's. As a result of the resetting to program the bits to the erased state, the sector of NVSM 128 (e.g., memory unit 134) may begin tracking state from an initial state. During the resetting of the sector of NVSM 128, state tracking may be disabled or the functions which are being tracked may be disabled. For example, when the status of write cache 14 is being tracked by memory unit 134, write caching may be disabled while the memory unit 134 is being reset, and write caching may then be enabled when the memory unit 134 is reset.

In some implementations, the sector of NVSM 128 is reset when neither the first state nor the second state is indicated by the sector. For example, if the sector does not match either a regular expression associated with the first state nor a regular expression associated with the second state, and error may have occurred during state tracking, and the sector may be reset to begin state tracking from an initial state.

In block 512, when the first state is not indicated or upon resetting of the sector of memory 134, DSD 106 proceeds with standard operation.

When the memory unit 134 is modified using the process described herein, multiple state changes may be recorded before the memory unit 134 is reset due to the bits of memory unit 134 being all 0's. Further, by using the process described herein, the useful life of memory unit 134 may be maximized. Memory unit 134 may eventually fail, due to degrading of flash memory. In particular, erasing the memory unit 134 may fail. When this occurs, state tracking may be disabled and the memory unit 134 may thereafter be unused. Alternatively, additional sectors may be added to memory unit 134 or memory unit 134 may be replaced.

Other Embodiments

While FIGS. 2, 3, and 4 illustrate generally programming bits from left to right, bits may generally be programmed from right to left, from some middle point outward, or in any other uniformly executed pattern. In addition, while programming bits from 1's to 0's is illustrated, bits may be programmed from 0's to 1's. Further, while programming of bits is illustrated, bytes, pages, sectors, blocks, or arrays may be used by programming 1's to 0's, 0's to 1's, or by any other uniform pattern. Accordingly, the terms "before" and "subsequent" may be used relative to any orientation or programming pattern, such as left to right, right to left, or any other uniformly executed pattern.

Those of ordinary skill in the art will appreciate that the various illustrative logical blocks, modules, and processes described in connection with the examples disclosed herein may be implemented as electronic hardware, computer software, or combinations of both. Furthermore, the foregoing processes can be embodied on a computer readable medium which causes a processor or computer to perform or execute certain functions.

To clearly illustrate this interchangeability of hardware and software, various illustrative components, blocks, and modules have been described above generally in terms of their functionality. Whether such functionality is implemented as hardware or software depends upon the particular application and design constraints imposed on the overall system. Those of ordinary skill in the art may implement the described functionality in varying ways for each particular application, but such implementation decisions should not be interpreted as causing a departure from the scope of the present disclosure.

The various illustrative logical blocks, units, modules, and controllers described in connection with the examples disclosed herein may be implemented or performed with a general purpose processor, a DSP, an ASIC, a FPGA or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The activities of a method or process described in connection with the examples disclosed herein may be embodied directly in hardware, in a software module executed by a processor, or in a combination of the two. The steps of the method or algorithm may also be performed in an alternate order from those provided in the examples. A software module may reside in RAM memory, flash memory, ROM memory, EPROM memory, EEPROM memory, registers, hard disk, a removable media, an optical media, or any other form of storage medium known in the art. An exemplary storage medium is coupled to the processor such that the processor can read information from, and write information to, the storage medium. In the alternative, the storage medium may be integral to the processor. The processor and the storage medium may reside in an Application Specific Integrated Circuit (ASIC).

The foregoing description of the disclosed example embodiments is provided to enable any person of ordinary skill in the art to make or use the embodiments in the present disclosure. Various modifications to these examples will be readily apparent to those of ordinary skill in the art, and the principles disclosed herein may be applied to other examples without departing from the spirit or scope of the present disclosure. The described embodiments are to be considered in all respects only as illustrative and not restrictive and the scope of the disclosure is, therefore, indicated by the following claims rather than by the foregoing description. All changes which come within the meaning and range of equivalency of the claims are to be embraced within their scope.

What is claimed is:

1. A method of programming a data pattern in a non-volatile memory to encode a state machine, the method comprising:
   (a) upon a first transition from a first state to a second state in the state machine, programming a first bit in a memory unit comprising a plurality of bits, wherein the memory unit is a unit of erasure in the non-volatile memory;
   (b) upon a first transition from the second state to the first state in the state machine, programming a second bit in the memory unit in the non-volatile memory, the second bit being before the first bit in the sequence of the plurality of bits within the memory unit;
   (c) upon a second transition from the first state to the second state in the state machine, programming a third bit in the memory unit, the third bit being subsequent to the first bit by at least two bits in the sequence of the plurality of bits within the memory unit; and
   (d) upon a second transition from the second state to the first state in the state machine, programming a fourth bit in the memory unit, the fourth bit being before the third bit in the sequence of the plurality of bits within the memory unit,
   wherein each of the programming in (a), (b), (c), and (d) programs the respective bit from an erased state to a non-erased state, and
   wherein (a), (b), (c), and (d) are performed without any intervening erase operation on the memory unit.

2. The method of claim 1, wherein the first state is represented by a bit sequence in the memory unit matching the regular expression 0*101*.

3. The method of claim 1, wherein the second state is represented by a bit sequence in the memory unit matching the regular expression 0*1*.

4. The method of claim 1, wherein for third and subsequent pairs of transitions from the first state to the second state and from the second state to the first state, the method further comprises repeating (c) and (d) for a new third bit and a new fourth bit in the sequence of the plurality of bits and treating a previous third bit for a previous pair of transitions as a new first bit.

5. The method of claim 1, further comprising erasing the memory unit to reset the plurality of bits to the erased state.

6. The method of claim 1, wherein the state machine represents a status related to an operation of a Data Storage Device (DSD).

7. The method of claim 6, wherein the status indicates a storage state of a volatile memory of the DSD, a power state of the DSD, a modification state of metadata stored in the DSD, or an environmental condition of the DSD.

8. The method of claim 1, wherein the memory unit comprises a byte, a sector, a page, or a block of data.

9. The method of claim 1, wherein the non-volatile memory comprises NOR or NAND flash.

10. The method of claim 1, wherein the second bit being before the first bit, the fourth bit being before the third bit, and the third bit being subsequent to the first bit comprises:
    the second bit being left of the first bit, the fourth bit being left of the third bit, and the third bit being right of the first bit, or
    the second bit being right of the first bit, the fourth bit being right of the third bit, and the third bit being left of the first bit.

11. A Data Storage Device (DSD) comprising:
    a non-volatile memory including a memory unit comprising a plurality of bits and being a unit of erasure in the non-volatile memory; and
    a controller configured to program a data pattern in the non-volatile memory to encode a state machine by at least:
    (a) upon a first transition from a first state to a second state in the state machine, programming a first bit in the memory unit;
    (b) upon a first transition from the second state to the first state in the state machine, programming a second bit in the memory unit, the second bit being before the first bit in the sequence of the plurality of bits within the memory unit;
    (c) upon a second transition from the first state to the second state in the state machine, programming a third bit in the memory unit, the third bit being subsequent to the first bit by at least two bits in the sequence of the plurality of bits within the memory unit; and
    (d) upon a second transition from the second state to the first state in the state machine, programming a fourth bit in the memory unit, the fourth bit being before the third bit in the sequence of the plurality of bits within the memory unit,
    wherein each of the programming in (a), (b), (c), and (d) programs the respective bit from an erased state to a non-erased state, and
    wherein (a), (b), (c), and (d) are performed without any intervening erase operation on the memory unit.

12. The DSD of claim 11, wherein the first state is represented by a bit sequence in the memory unit matching the regular expression 0*101*.

13. The DSD of claim 11, wherein the second state is represented by a bit sequence in the memory unit matching the regular expression 0*1*.

14. The DSD of claim 11, wherein for third and subsequent pairs of transitions from the first state to the second state and from the second state to the first state, the controller is further configured to repeat (c) and (d) for a new third bit and a new fourth bit in the sequence of the plurality of bits and treating a previous third bit for a previous pair of transitions as a new first bit.

15. The DSD of claim 11, wherein the controller is further configured to erase the memory unit to reset the plurality of bits to the erased state.

16. The DSD of claim 11, wherein the state machine represents a status related to an operation of the Data Storage Device (DSD).

17. The DSD of claim 16, wherein the status indicates a storage state of a volatile memory of the DSD, a power state of the DSD, a modification state of metadata stored in the DSD, or an environmental condition of the DSD.

18. The DSD of claim 11, wherein the memory unit comprises a byte, a sector, a page, or a block of data.

19. The DSD of claim 11, wherein the non-volatile memory comprises NOR or NAND flash.

20. The DSD of claim 11, wherein the second bit being before the first bit, the fourth bit being before the third bit, and the third bit being subsequent to the first bit comprises:
the second bit being left of the first bit, the fourth bit being left of the third bit, and the third bit being right of the first bit, or
the second bit being right of the first bit, the fourth bit being right of the third bit, and the third bit being left of the first bit.

21. A non-transitory computer readable medium storing computer-executable instructions for operating a Data Storage Device (DSD), wherein when the computer-executable instructions are executed by a controller of the DSD, the computer-executable instructions cause the controller to:
(a) upon a first transition from a first state to a second state in a state machine encoded by a non-volatile memory, programming a first bit in a memory unit comprising a plurality of bits, wherein the memory unit is a unit of erasure in the non-volatile memory;
(b) upon a first transition from the second state to the first state in the state machine, programming a second bit in the memory unit in the non-volatile memory, the second bit being before the first bit in the sequence of the plurality of bits within the memory unit;
(c) upon a second transition from the first state to the second state in the state machine, programming a third bit in the memory unit, the third bit being subsequent to the first bit by at least two bits in the sequence of the plurality of bits within the memory unit; and
(d) upon a second transition from the second state to the first state in the state machine, programming a fourth bit in the memory unit, the fourth bit being before the third bit in the sequence of the plurality of bits within the memory unit,
wherein each of the programming in (a), (b), (c), and (d) programs the respective bit from an erased state to a non-erased state, and
wherein (a), (b), (c), and (d) are performed without any intervening erase operation on the memory unit.

22. The non-transitory computer readable medium of claim 21, wherein the state machine represents a status related to an operation of a Data Storage Device (DSD).

* * * * *